United States Patent
Kondrus et al.

(10) Patent No.: US 12,157,028 B2
(45) Date of Patent: Dec. 3, 2024

(54) PROTECTIVE HOUSING IN THE EXPLOSION PROTECTION CATEGORY FLAMEPROOF ENCLOSURE

(71) Applicant: R. STAHL SCHALTGERÄTE GMBH, Waldenburg (DE)

(72) Inventors: Elena Kondrus, Künzelsau (DE); Bernd Limbacher, Schwäbisch Hall (DE); Jürgen Schmitt, Öhringen (DE); Helmut Würz, Niedernhall (DE)

(73) Assignee: R. STAHL SCHALTGERÄTE GMBH, Waldenburg (DE)

( * ) Notice: Subject to any disclaimer, the term of this patent is extended or adjusted under 35 U.S.C. 154(b) by 527 days.

(21) Appl. No.: 17/432,933

(22) PCT Filed: Feb. 14, 2020

(86) PCT No.: PCT/EP2020/053901
§ 371 (c)(1),
(2) Date: Aug. 22, 2021

(87) PCT Pub. No.: WO2020/169471
PCT Pub. Date: Aug. 27, 2020

(65) Prior Publication Data
US 2022/0184435 A1  Jun. 16, 2022

(30) Foreign Application Priority Data
Feb. 22, 2019 (DE) .................. 10 2019 104 616.5

(51) Int. Cl.
*A62C 4/00* (2006.01)
(52) U.S. Cl.
CPC ....................... *A62C 4/00* (2013.01)
(58) Field of Classification Search
CPC ................... A62C 4/00; H02G 3/088
(Continued)

(56) References Cited

U.S. PATENT DOCUMENTS 3,974,933 A * 8/1976 Toth ............... E05B 65/006
174/50
4,600,114 A   7/1986 Dabich
(Continued)

FOREIGN PATENT DOCUMENTS

CH      480744 A    8/2013
CN   102860147 A    1/2013
(Continued)

OTHER PUBLICATIONS

Communication pursuant to Article 94(3) EPC dated Dec. 8, 2023; EP Application No. 20705195.4, 9 pages (non-English).
(Continued)

*Primary Examiner* — Steven J Ganey
(74) *Attorney, Agent, or Firm* — CANTOR COLBURN LLP

(57) ABSTRACT

A protective housing in explosion-protection-type pressure-proof encapsulation. At least one device for reducing explosive pressure is associated with the housing. The housing includes a first housing part having a first sealing surface and a second housing part having a second sealing surface, wherein, when the housing is in the closed pressure-proof state, a resilient seal is held between the first sealing surface and the second sealing surface so as to be elastically deformed, and, as a result, closes the space between the first sealing surface and the second sealing surface in a flame-proof manner in the event of an explosion inside the housing. The flame-proof arrangement can replace a planar gap between, for example, a surface of a cover and a surface of a housing part, which gap requires conformity to relatively narrow manufacturing tolerances.

19 Claims, 8 Drawing Sheets

(58) Field of Classification Search
USPC ........................................ 169/48, 54; 174/50
See application file for complete search history.

(56) References Cited

U.S. PATENT DOCUMENTS

| | | | |
|---|---|---|---|
| 4,620,061 A | * | 10/1986 | Appleton ................ H02G 3/14 |
| | | | 174/51 |
| 4,664,281 A | | 5/1987 | Falk et al. |
| 10,779,429 B2 | | 9/2020 | Clarke et al. |
| 2009/0008119 A1 | | 1/2009 | Zamfes |
| 2013/0206759 A1 | | 8/2013 | Wurz et al. |
| 2013/0240220 A1 | | 9/2013 | Loureiro et al. |
| 2014/0085781 A1 | | 3/2014 | Zeng |
| 2021/0120682 A1 | | 4/2021 | Kondrus et al. |

FOREIGN PATENT DOCUMENTS

| | | | |
|---|---|---|---|
| CN | 202712771 U | 1/2013 | |
| CN | 103260710 A | 8/2013 | |
| DE | 1801062 A | 10/1969 | |
| DE | 2617965 B2 | 4/1980 | |
| DE | 3436300 C2 | 5/1993 | |
| DE | 102007003009 A1 | 7/2008 | |
| DE | 102010015674 A1 | 10/2011 | |
| DE | 102010016782 A1 | 11/2011 | |
| DE | 102013111374 | 4/2015 | |
| EP | 2561732 A1 | 2/2013 | |
| EP | 3087313 B1 | 2/2018 | |
| EP | 3579671 A1 | 12/2019 | |
| GB | 778040 A | 7/1957 | |
| RU | 2602430 C2 | 1/2013 | |
| WO | 2011131265 A1 | 10/2011 | |
| WO | 2013109305 A1 | 1/2013 | |
| WO | 2020160937 A1 | 8/2020 | |

OTHER PUBLICATIONS

Kristin Breunig et al: "Control cabinet", Jan. 22, 2019, 2 pages [non-English].
Kristin Breunig et al: "Control cabinet", Jan. 22, 2019, 2 pages [machine translation].
English Translation to International Search Report for Application No. PCT/EP2020/053901.
International Search Report for Application No. PCT/EP2020/053901.
Written Opinion for Application No. PCT/EP2020/053901.
German Office Action for Application No. 10 2019 104 616.5; Date Issued: Jan. 10, 2020.
Office Action dated Jun. 29, 2023; RU Application No. 2021127200/07; 7 pages (non-English).
Office Action dated Sep. 14, 2023; Chinese Application No. 202080015870.X; 8 pages (non-English).
Search dated Jun. 29, 2023; RU Application No. 2021127200/07; 3 pages (non-English).

* cited by examiner

PROTECTIVE HOUSING IN THE EXPLOSION PROTECTION CATEGORY FLAMEPROOF ENCLOSURE

CROSS REFERENCE TO RELATED APPLICATIONS

This application is a National Stage of PCT Application No. PCT/EP2020/053901 filed on Feb. 14, 2020, which claims priority to German Patent Application No. 10 2019 104 616.5 filed on Feb. 22, 2019, the contents each of which are incorporated herein by reference thereto.

TECHNICAL FIELD

The invention refers to a protective housing in the explosion protection category flameproof enclosure.

BACKGROUND

Housings are known from the prior art that are configured according to the explosion protection category flameproof enclosure. This allows the collection of an explosive gas mixture inside the housing and an explosion thereof by igniting sparks, formed by an electrical operating device in the housing. According to the protection category, it is also allowed that gas or particles may escape during the explosion through gaps from the interior of the housing outwardly where an explosive atmosphere may be present. However, according to the explosion protection category, it has to be precluded that the gas is thus hot or the particles are thus hot or glowing that the explosive atmosphere outside the housing can be ignited.

DE 10 2010 016 782 A1 describes a pressure relief device for flameproof enclosures. It is configured to be arranged in a housing part and to reduce the amount of the created pressure peaks during progress of an explosion-like reaction in the interior, in that created gases may flow out of the housing through the pressure relief device quickly and simply.

An apparatus housing have an explosion-protected chamber is known from DE 34 36 300 C2. The housing comprises a liner as first housing part and a cover as second housing part. Liner and cover comprise flanges in order to establish a flange joint between the liner and the cover. Gaps between the flanges through which gas or particles may escape outwardly from the interior of the housing during an explosion are allowed. They are however dimensioned such that gas ignited inside the hollow interior of the housing is sufficiently cooled prior to exiting the housing through gaps between the flanges. A sealing may be arranged between the flanges in order to avoid ingress of humidity into the housing.

A housing denoted to be flameproof is known from DE 26 17 965 B2 that comprises a housing bottom part and a housing top part. The two parts form an interstice that is denoted as gap space. A sealing is arranged at the gap space between the housing top part and the housing bottom part. Together with spring elements it serves to hold the housing bottom part and the housing top part together. The spring elements are arranged in the interstice. The interstice is filled with cast resin. It is indicated that a flameproof housing configured without gap is obtained by filling the gap with cast resin.

DE 10 2007 003 009 A1 describes a method for manufacturing of a fluid-tight housing as well as a fluid-tight housing. The housing comprises a base part and a plate-like cover as well as a sealing arranged between facing joint surfaces of the base part and the cover for fluid-tight sealing of the housing interior. Base part and cover are attached to one another in a pretensioned manner, such that the elastic sealing is deformed. In doing so, it is precluded that gas from the environment of the housing reaches one of the ignition sources that are located inside the fluid-tight housing.

An explosion-proof arrangement for electrical and/or electronic components is known from DE 10 2013 111 374 A1. This arrangement comprises a carrier and a cover body. The cover body defines at least one chamber for the components. Between the cover body and the carrier an elastic coupling element is arranged that completely surrounds the opening in the cover body. If the cover body and the carrier are connected by means of a force-fit and/or form-fit connection, the coupling element between the cover body and the carrier is thereby elastically deformed. By means of the explosion-proof arrangement the requirements shall be complied with, as they are defined for an encapsulation by cast (Ex-m) or a flameproof enclosure (Ex-d). In case of an encapsulation by cast (Ex-m), an explosive atmosphere is kept away from the interior of a housing.

DE 1 801 062 A discloses a flameproof housing made of steel sheet metal parts connected by welding.

In order to contact electrical operation means inside a housing of the protection category flameproof enclosure, a housing part can comprise an opening for arrangement of a cable or a cable feed-through. An Ex-gap (flameproof gap) can be configured between the opening and the feed-through that can be configured as cylindrical gap or threaded gap.

BRIEF SUMMARY

It is the object of the present invention to provide an improved concept for a housing in the protection category flameproof enclosure.

Disclosed is a protective housing in the explosion protection category of flameproof enclosures, wherein a device for reduction of explosion pressure is assigned to the protective housing, wherein the protective housing comprises a first housing part having a first sealing surface and a second housing part having a second sealing surface, wherein an elastical sealing body is held elastically deformed between the first sealing surface and the second sealing surface in a flameproof closed condition of the protective housing and a space between the first sealing surface and the second sealing surface is closed in a flameproof manner in case of an explosion in the interior of the protective housing, wherein the elastical sealing body when elastically deformed is free of through passages.

The protective housing according to the invention (in the following also denoted only as housing) in the protection category flameproof enclosure comprises a first housing part having a first sealing surface and a second housing part having a second sealing surface. Preferably a device for reducing explosion pressure is assigned to the housing. An elastical sealing is retained in an elastically deformed manner between the first sealing surface and the second sealing surface and thereby closes the space between the first sealing surface and the second sealing surface in case of an explosion in the interior of the housing in a flameproof manner.

The sealing body itself is free of through passages and thus impermeable for explosion gas. No paths formed by gaps, pores or other passages extend through the sealing body that would gas—also gas that is not cooled below an ignition temperature of the atmosphere—to pass through the sealing body in case of an explosion. This does not mean that the sealing body of the arrangement of the sealing body between the sealing surfaces has to be diffusion tight.

By means of the elastically deformed sealing body the joint between the first housing part and the second housing part is also closed at least thus far in case of the occurrence of an explosion that explosion gases passing through a gap extending through the joint that possibly remains are cooled thus far that they cannot ignite an explosive atmosphere outside of the housing. A passage-free configuration of the sealing body extends beyond the requirement of a flameproof closure of the joint, because gaps in the sealing body, as far as they are present at all, are even further closed as it would be necessary for the flameproof configuration.

In the protection housing according to the invention, a flat gap, for example, as they are provided in the prior art in pressure housings of the protection category "flameproof enclosure" between a housing body and a cover, can be replaced by an arrangement of an elastical sealing body between two sealing surfaces, as proposed according to the invention. While a flameproof flat gap is defined between cover and housing body in the prior art, in the embodiments according to the invention the space between the sealing body and the first housing part is at least narrowed thus far such that it is secured against ignition breakthrough and between the sealing body and the second housing part narrowed at least thus far that it is secured against ignition breakthrough. Possibly remaining gaps between the sealing body and the first housing part and between the sealing body and the second housing part comply with the requirements of flameproof Ex-gaps, for example according to the standard EN 6079-1, in terms of gap width and gap length. In doing so, complying with small manufacturing tolerances is avoided, as it is necessary for the manufacturing of a joint between cover and housing body that form a flat gap.

Obviously, if no explosion occurs, the sealing can preferably in addition serve to prevent ingress of humidity through the joint between the first sealing surface and the second sealing surface. Main task of the sealing is, however, to maintain the joint in a flameproof condition in case of an explosion.

Examples of further advantageous embodiments of the invention and examples of preferably provided features are described in the following:

In a preferred embodiment the second housing part comprises an additional second sealing surface and the housing comprises a third housing part having a third sealing surface, wherein in a flameproof closed condition of the housing an additional elastic sealing body is held in an elastically deformed manner between the additional second sealing surface and the third sealing surface and thereby closing the space between the additional sealing surface and the third sealing surface in case of an explosion in the interior of the housing in a flameproof manner.

The second housing part can be an intermediate frame. One or more cover parts can be attached to the intermediate frame, preferably in a hinged manner, that can form third housing parts of the housing.

The connection between the first housing part and the second housing part and/or between the second housing part and the third housing part, as far as it is present, is preferably releasable in an undestructive manner. This connection can be established, for example, by means of a bolt or screw connection. Preferably thereby neither the first housing part nor the second housing part and preferably nor the sealing are destructed and/or preferably thereby neither the second housing part nor the third housing part and preferably in addition nor the additional sealing are destructed. The sealing is preferably reusable after opening the housing, particularly preferably for sealing the space or joint between the first housing part and the second housing part, if the first housing part and the second housing part are connected with each other. Alternatively or in addition, this can apply for the additional sealing, if present.

The first housing part can, for example, surround an opening, i.e. the housing part alone defines an opening. As an alternative the housing part can define an opening together with additional first housing parts. In any case, the opening can be closed by means of the second housing part. In other embodiments the second housing part can define an opening in the first housing part, wherein the opening can be closed by means of a third housing part.

Preferably the opening that can be closed by means of the second housing part or the third housing part is an access opening of the housing. An access opening is configured and provided for providing access to the interior of the housing or to the operating apparatus arranged in the housing for the user of the housing or the electrical operating apparatus provided therein. The user of the housing can equip the interior of the housing with an operating apparatus and/or execute a modification, a repair and/or an action for operating of the operating apparatus by means of the access opening. Access openings can be so large that the hand of a user passes through the access opening. Access openings in housing parts for location of electrical feed-throughs, particularly conductor feed-throughs of electrical conductors or for arrangement of a fluid conductor for guiding a fluid into or out of the housing, are not considered as access opening in the sense of this application. Also openings for arrangement of, for example, actuators or indicators, particularly light indicators, are not considered as access openings in the sense of this application. Also openings in parts of electrical feed-throughs, parts of conductor feed-throughs, parts of inlets of fluid lines, parts of actuators or (light) indicators are not considered as access openings in the sense of this application.

The first housing part and the second housing part and/or potentially the third housing part are preferably configured to separate the interior of the housing from the atmosphere surrounding the housing. Openings of the first housing part, the second housing part and/or the third housing part leading from the interior of the housing to the atmosphere around the housing are closed in a flameproof manner in the explosion-proof closed condition of the housing.

The first housing part and/or the second housing part is particularly preferably wall-shaped, tub-shaped, frame-shaped or box-shaped or preferably at least wall section, tub section or box section shaped and/or the first housing part and/or the second housing part forms a section of a frame that may be closed by wall parts. The first housing part can be, for example, a frame part or a tub or a box-shaped part or section thereof and the second housing part can be a wall part, e.g. a side wall part, a cover or a bottom or a section thereof.

For closing the housing, the sealing can be arranged on the first sealing surface and the second sealing surface and where appropriate, attached in a form-fit, force-fit and/or substance bond manner and subsequently, the first sealing surface and the second sealing surface can be arranged adjacent to one another or in abutment to one another for elastic deformation. As an alternative, for closing the housing the additional sealing body can be arranged on one of the additional second sealing surfaces and the third sealing surface and where appropriate, can be attached in a form-fit, force-fit and/or substance-bond manner and subsequently the additional second sealing surface and the third sealing surface can be arranged adjacent to one another or in abutment to one another for elastical deformation of the additional sealing body.

The sealing body and/or the additional sealing body can be, for example, closed in a ring-shaped manner. The sealing body and/or the additional sealing body surrounds accordingly preferably the opening in the housing. The sealing body and/or the additional sealing body can consist of elastomer or can comprise elastomer or can consist of other elastical materials. For example, the sealing body and/or the additional sealing body can be formed of metal, particularly sheet metal. The sealing body can comprise closed-cell material or open-cell material, wherein however all passages through the pores through the sealing body are blocked. The sealing body and/or the additional sealing body can comprise an entangled fiber body, e.g. of metal fibers, the pores of which are at least partly closed by means of an elastomer, such that passages through the sealing body are avoided.

Also openings of larger diameter in the housing can be closed, as provided by the invention. The ratio of the length of a space (that can also be denoted as joint) between the first sealing surface and the second sealing surface to the width of the space between the first sealing surface and the second sealing surface provided with the elastically deformed sealing body in between for a flameproof sealing that is filled by the elastically deformed sealing can be, e.g. larger than 100. In embodiments the ratio of the length of the space (that can only be denoted as joint) between the additional second sealing surface and the third sealing surface to the width of the space between the additional second sealing surface and the third sealing surface provided with the elastically deformed additional sealing body in between for flameproof sealing that is filled by means of the elastically deformed sealing body can be, e.g. larger than 100. Manufacturing tolerances for manufacturing of the first and the second housing part and/or the second and the third housing part, particularly for manufacturing the first sealing surface and the second sealing surface and/or the additional second sealing surface and the third sealing surface can be less strict than for the manufacturing of parts with surfaces that shall define a flameproof flat gap between the surfaces.

With the inventive sealing body small damages or unevenesses are of the sealing surfaces can be compensated. Contrary thereto the surfaces of housing parts in the prior art that adjoin one another in order to form a flat gap between the surfaces, have to comply with strict requirements with regard to integrity and evenness in order to preclude passage of gas mixtures through the flat gap that are able to ignite. The inventive concept is thus of particular advantage, if the housing is reclosable, because in the opened condition a damaging of the sealing surfaces or the surfaces that limit the flameproof flat gap in the prior art can possibly occur.

Due to its elasticity, the sealing body can compensate many a damages and can close the joint despite the damage in a flameproof manner, while the housing known from the prior art having a flat gap with a damage at a respective location may be unusable and has to be replaced.

Preferably a spacer is arranged that defines a minimum distance between the first sealing surface and the second sealing surface. In doing so, it is avoided that the sealing is pressed between the first sealing surface and the second sealing surface so far that the sealing, for example by plastic deformation, is damaged to such an extent that it becomes unusable for the flameproof sealing or that the sealing can at least not be reused during reclosure of the housing. Preferably the first housing part and/or the second housing part is pressed against the spacer, if the connection between the first housing part and the second housing part is established, so that the minimum distance is defined as distance between the first sealing surface and the second sealing surface in the space that is filled by the sealing.

In order to protect the sealing, the first sealing surface and/or the second sealing surface can preferably have an elongated structure. For example, the structure can be a groove. The sealing can be arranged adjacent to or in the structure. As an alternative, the sealing can be a flat sealing that is particularly not arranged in a groove.

Preferably the elastically deformed sealing body touches the first sealing surface and the second sealing surface. As an alternative, a second sealing body can be arranged in an elastically deformed manner between the elastically deformed sealing body and the first sealing surface and/or between the elastically deformed sealing body and the second sealing surface, for example, such that the sealing bodies form a stack between the first sealing surface and the second sealing surface.

The at least one device for reducing the explosion pressure that is preferably assigned to the housing, is configured and provided to limit the maximum overpressure that can be created due to an explosion in the interior of the housing to a maximum value that is smaller than the maximum value that would occur in the same housing without the at least one device.

The at least one device for reducing the explosion pressure can comprise a pressure relief body that is arranged in or at an opening of the housing toward the environment of the housing, in order to release gas from the interior of the housing for the purpose of relief in case of an explosion. Such a pressure relief body is configured according to the protection category flameproof enclosure (Ex d, EN 6079-1 (standard)).

As an alternative or in addition, the at least one device for reducing explosion pressure can comprise a device that is unable to release gas from the housing that, however, can absorb heat and/or kinetic energy of the explosion, in order to limit the maximum overpressure due to the explosion.

The device for reducing the explosion pressure preferably comprises open-cell material. Open-cell material can effectively cool the gas due to its large surface in order to reduce the maximum explosion pressure. Open-cell material can be, for example, fiber material, e.g. metal fiber material, that can be processed to form a woven material, a non-woven material or a felt material, for example, or that can be formed by a bulk of pourable particle material.

The at least one device for reduction of explosion pressure is preferably configured and provided to reduce an explosion overpressure (overpressure above atmospheric pressure) of some bar, particularly larger or equal to 10 bar, that would occur if the at least one device would not be arranged in the otherwise unmodified housing to an overpressure of, for example, smaller or equal to 1 bar. The inventors have recognized that the possibility for arrangement of an elastical sealing body that closes the joint between two housing parts in a flameproof manner is also offered for housings having an inner volume of 1 liter or more or even 1000 liters or more, if such a device for reduction of explosion pressure is provided, wherein in the prior art a flameproof flat gap limited by two housing parts was provided, for example. The first sealing surface and the second sealing surface together with the elastically deformed sealing body arranged in between can therefore replace a flameproof gap that was limited by the first sealing surface on one side and the second sealing surface on the other side in the prior art. In embodiments of the invention the flat gap, limited by the first sealing surface on one side and the second sealing surface on the other side can be replaced by a flameproof or narrower gap between the first sealing surface and the sealing body and a flameproof or narrower gap between the second sealing surface and the sealing body.

BRIEF DESCRIPTION OF THE DRAWINGS

Additional advantageous embodiments and features are derived from the following description, the dependent claims, as well as the figures:

The figures show by way of example and schematically.

DETAILED DESCRIPTION

The inventive protective housing 10 (in the following also briefly denoted housing) complies preferably with the protection category "flameproof enclosure". Requirements for housings of this protection category are, e.g. described in the standard EN 60079-1 (Ex-d) or in corresponding other standards, e.g. US-American standards. For housings according to this protection category, it is determined that the housing has to withstand the pressure of an explosion of an explosive mixture in the interior of the housing and has to avoid the transmission of the explosion to the explosive atmosphere surrounding the housing.

Figure 1:
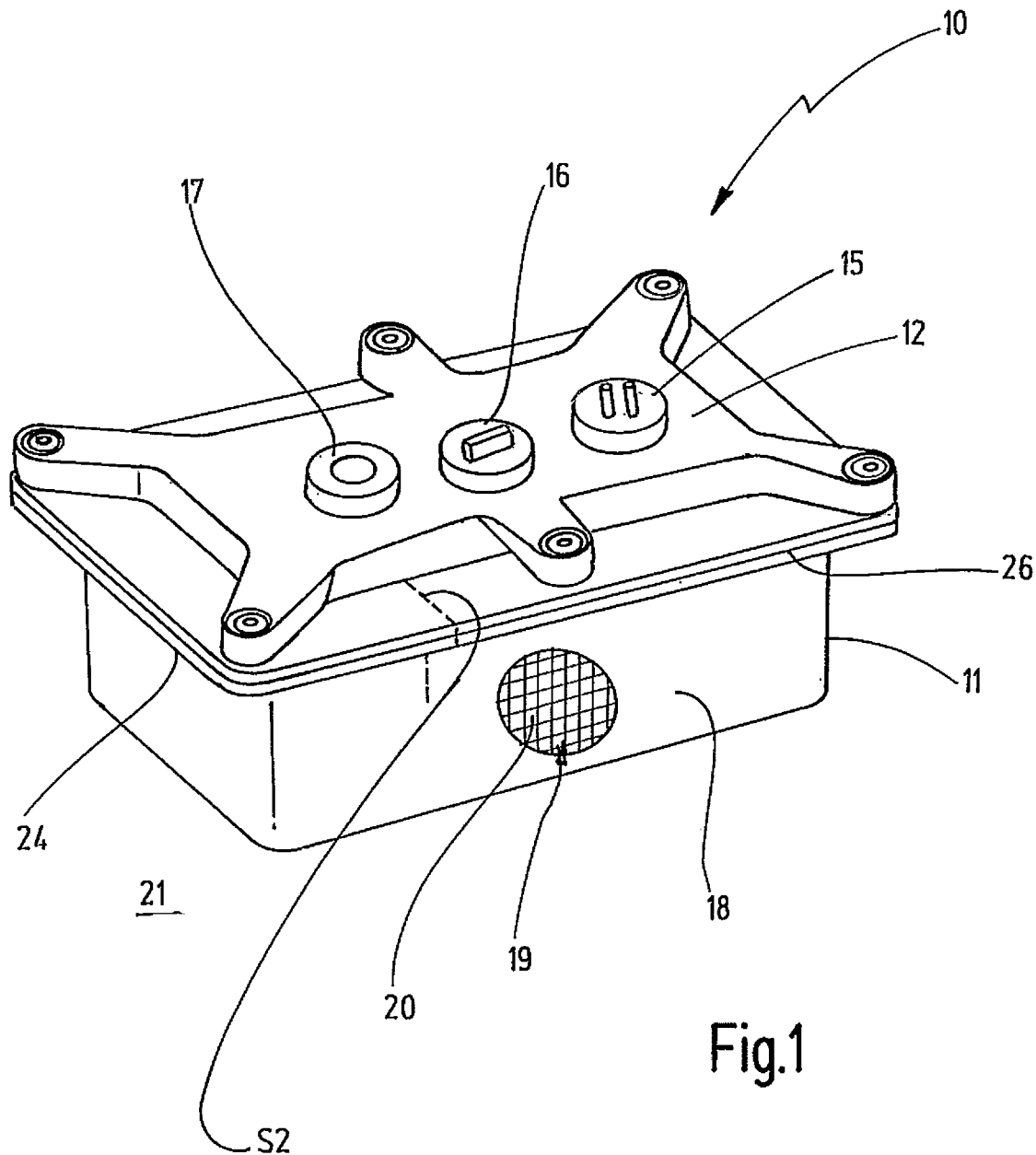
FIG. 1—a perspective view of an embodiment of the inventive protective housing in the protection category flameproof enclosure.

In embodiments, as illustrated in FIG. 1 by way of example, the inventive housing 10 comprises a tub-shaped or box-shaped first housing part having a bottom (covered in FIG. 1), which first housing part 11 is closed by a cover 12 that forms a second housing part. The housing parts 11, 12 are preferably metal parts, e.g. made of aluminum, particularly an aluminum alloy, steel or grey cast iron. The first sealing surface 13 and the second sealing surface 14 comprised by the first housing part 11 or the second housing part 12, consist preferably of metal, e.g. of aluminum, particularly an aluminum alloy, steel or grey cast iron.

The first housing part 11 and/or the cover 12 can comprise openings for feed-throughs, such as tube feed-throughs and electrical feed-throughs 15 or openings for arrangement of actuating elements 16 or displays or indicators. In the illustrated embodiment an electrical feed-through 15 for supply of an operating apparatus in the interior of the housing with electrical power, an actuating device 16 as well as a display unit 17 is arranged in an opening of the first housing part.

The first housing part 11 comprises in addition an opening in a side wall 18 that is closed by means of a pressure relief device 19. The pressure relief device 19 comprises a pressure relief body 20 that allows a gas exchange between the interior of the housing 10 and the outer environment 21 through the opening and the pressure relief device 19. According to the protection category flameproof enclosure, however, gaps through the pressure relief body 20 are configured (particularly so long and so narrow), such that gas or particles that pass through the pressure relief body 20 outwardly in case of an explosion, are cooled to an extent that they cannot ignite an ignitable atmosphere outside the housing 10. The gaps are thus denoted as flameproof gaps.

The pressure relief device 19 can be screwed in the opening in the side wall 18 of the first housing part 11, whereby it is ensured that the gap—a threaded gap—between the first housing part 11 and the pressure relief device 19 is flameproof. Also the other feed-throughs and accessory elements such as actuating devices and indicators, define flameproof gaps together with the openings in the housing in which they are arranged.

Figure 2:
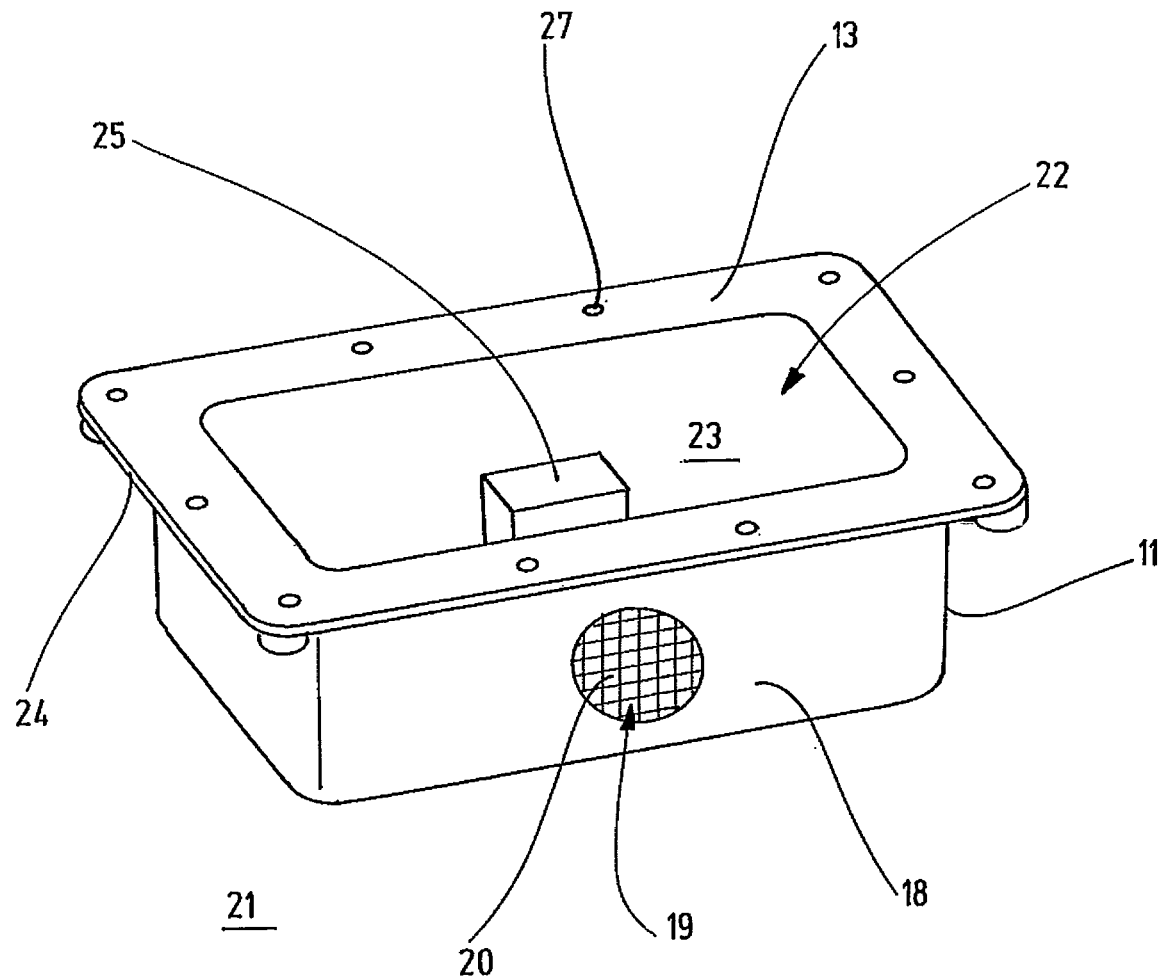
FIG. 2—a perspective view of a first housing part of the protective housing shown in FIG. 1.

The first housing part comprises an access opening 22 to a chamber 23 in the housing 10 (see FIG. 2). The access opening 22 is surrounded by a flange 24. The access opening 22 to the chamber 23 in the first housing part 11 is closed by means of the cover 12. In the illustrated embodiment the cover 12 is screwed to the first housing part 11 for the purpose of closing. Other connection possibilities can be considered in general, e.g. a latched connection. The chamber 23 comprises at least one electrical operating apparatus 25 that can create sparks. Inventive housings 10 enclose preferably inner volumes of at least 1 cubic decimeter, particularly preferably at least 4 cubic decimeters. Embodiments can particularly comprise an interior volume of at least 10 cubic decimeters. According to the invention, also housings with housing volumes of, e.g. 2000 liters can be created. An inventive housing 10 thus comprises preferably a relatively large inner volume that can contain a correspondingly large amount of an ignitable gas mixture. Also the circumference (the closed lengths) of the joint 26 between the first housing part 11 and the cover 12 can be accordingly long.

The sealing surface 13 of the first housing part 11 (first sealing surface) is arranged inside an arrangement of devices for screwing, e.g. bores 27 for location of bolts with outer thread. FIG. 2 shows the exemplary inventive housing 10 according to FIG. 1 with opened first housing part 11.

Figure 3:
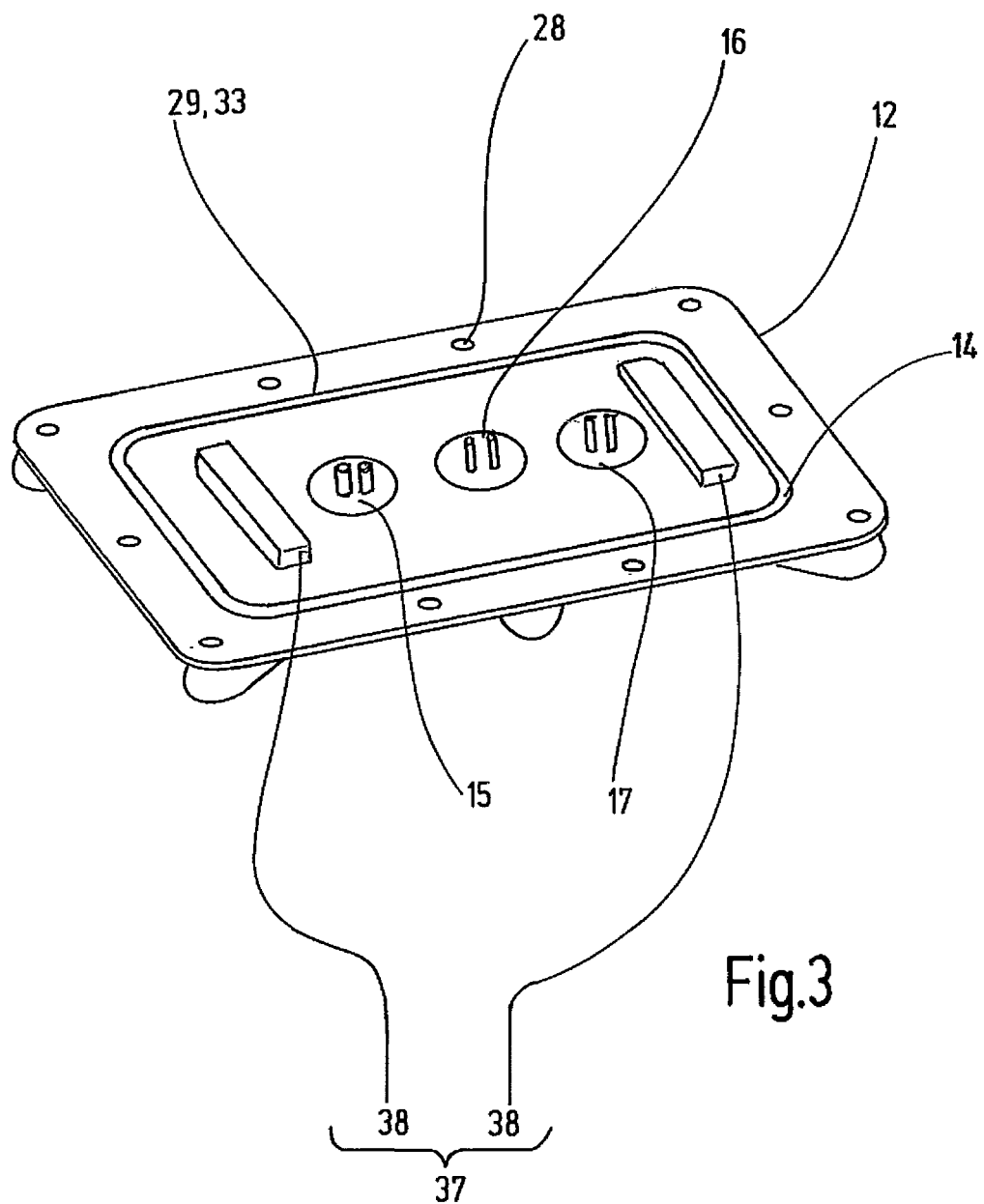
FIG. 3—a perspective view of a cover of the protective housing shown in FIG. 1.

The cover 12 that is illustrated in FIG. 3 with view on the inner side, comprises an arrangement of counter devices for screwing of cover and first housing part, e.g. bores 28 for location of threaded bolts. Inside the arrangement in the surface facing the flange 24 in closed condition of the housing 10 a groove can be arranged. A groove 30 can, however, also be avoided such that the second housing part 12 has a stepless surface in the area of the sealing surface 14 of the cover 12 (second sealing surface). As an alternative or in addition to a groove 30 in the cover 12, a groove can be processed in the surface of the flange 24 of the first housing part 11 closed along the circumference. The circumferential form of the illustrated groove is rectangular, according to the form of the access opening 22. The circumferential form can, however, also be configured differently, particularly according to the form of a differently formed housing 10 and/or access opening 22. The groove 30 comprises a groove bottom 31 that forms a second sealing surface 14.

Figure 4:
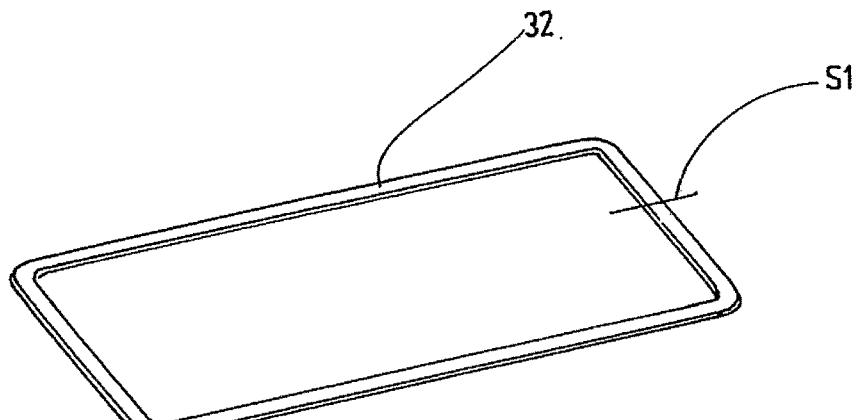
FIG. 4—a perspective view of a sealing ring that can be arranged between the cover and the first housing part shown in FIG. 1, FIG. 5—a cross-sectional illustration through a sealing ring with an enlarged illustrated section, FIG. 6—a schematic side view illustration in the interior of the inventive protective housing, FIG. 7—a partly sectional illustration through the joint between cover and first housing part of the housing according to FIG. 1, FIG. 8—a partly sectional illustration through the joint between the first housing part and the second housing part of an inventive protective housing, FIG. 9a—a sealing body embodiment of a further embodiment of the inventive housing, FIG. 9b—a cross-section through the embodiment with the sealing body according to FIG. 9a, FIG. 10a—an embodiment of the inventive housing according to yet another embodiment in a perspective view, FIG. 10b—the housing according to FIG. 10a with opened cover elements, FIG. 10c—a view of a part of a cross-section through the housing according to FIG. 10a and FIG. 10d—an enlarged section of the view according to FIG. 10c.

In FIG. 4 a rectangular pre-manufactured sealing ring 32 that is closed in circumferential direction is illustrated as sealing body in released condition. As a ring the sealing 32 is circumferentially closed. This means it comprises no gap or cut that would separate the sealing ring 32 transverse to the circumferential direction. The illustrated released sealing 32 has a rectangular cross-section. The sealing 32 can, however, also have other polygonal, e.g. square, or e.g. circular, oval or elliptical cross-sections. The sealing ring 32 can consist, for example, of polymer. Also a sealing ring 32 of metal, e.g. sheet metal, is possible. The sealing ring 32 can be glued on the cover 12, particularly on the second sealing surface 14 of the cover 12—this is not illustrated in FIG. 3. For example, the sealing ring 32 can be glued in the groove 30, particularly groove bottom 31. The sealing 32 can be foamed, can be configured as stamped sealing or syringed as endless round cord seal. Alternatively to a pre-manufactured sealing ring, the sealing can be syringed (two components that together form an elastomer), foamed, extruded on the surface to be sealed by means of an appropriate additive manufacturing method. The sealing ring 32 can, for example, be configured seamlessly or glued at the ends. Exemplary alternative embodiments of the sealing ring 32 will be described in connection with FIG. 5. The sealing ring 32 can be pre-compressed and/or soaked in order to provide the sealing 32 specifically with predefined distinct characteristics, such as modulus of elasticity or restoring force, water repellence, fire behavior and UV or aging protection.

The surface 29 of the cover 12 adjoining the groove 30 or the groove walls form a spacer 33 that provides for a minimum distance of the first sealing surface 13 and the second sealing surface 14, if the cover 12 is attached on the first housing part 11 with elastically compressed sealing 32 arranged therebetween. If the surface 29 of the cover 12 around the groove 30 and the second sealing surface 14 or the surface sections around the second sealing surface 14 are in abutment in closed condition of housing 10, it is ensured that the minimum distance is provided as distance between the first sealing surface 13 and the second sealing surface 14. The sealing 32 is thus compressed by a predefined amount or to a predefined amount. This avoids damages or excessive other deformations of the sealing 32 than elastical deformations and otherwise guarantees that the elastic sealing 32 is sufficiently deformed, i.e. applies a sufficiently strong spring force on the cover 12 and the first housing part 11 or the second sealing surface 14 and the first sealing surface 13, in order to maintain the joint between the cover 12 and the housing part 11 closed in a flameproof manner, also in case of the occurrence of an explosion. The spacer 33 can also be formed in another manner than by a groove 30 by means of a structure of projections arranged in a row or via a projection that is closed in circumferential direction (not illustrated) that projects adjacent to the first sealing surface 13 and/or the second sealing surface 14. Alternatively, one or more spacers can be included in the sealing ring (not illustrated) that avoid a compression of the sealing ring 32 below a certain amount.

Figure 5:
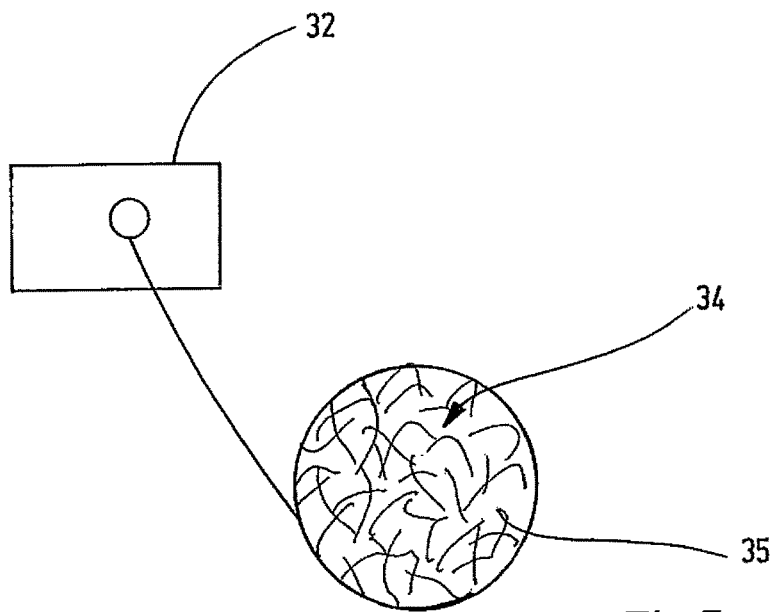

FIG. 5 shows a cross-sectional view through an exemplary embodiment of a released elastically deformable sealing ring according to a virtual section line S1, as illustrated in FIG. 4. The sealing 32 can particularly comprise closed cell material. As apparent by way of the example from the sectional enlargement that is also illustrated in FIG. 5, the sealing ring 32 can be or comprise an entangled fiber body. The entangled fiber body itself comprises open pores 34. This means that without additional measures as described in the following, gas could pass from one side of the entangled fiber body 32 through the entangled fiber body through the open pores 34 formed between the irregularly arranged fibers 35 and exit the entangled fiber body again. Thus, the entangled fiber body 32 would not be free of through passages. This is, however, avoided by the measure that the pores 34 are at least partly filled with elastomer 36 in order to close the paths (gaps) through the pores 34 and to obtain in this sense closed pores 34. The pores 34 are already closed in the released condition of the sealing ring 32 or at least in the elastically deformed condition between the first sealing surface 13 and the second sealing surface 14. A sealing 32 configured in this manner comprises a high mechanical strength. This is of particular advantage, if the housing 10 can be reclosed with reuse of the sealing 32.

As an alternative or in addition to the pressure relief device 19 that allows a gas exchange between the inner volume of the housing 10 and the outer atmosphere, at least one pressure relief device 37 for internal pressure reduction can be assigned to the housing 10 that limits the explosion pressure to a certain maximum value, which is below the pressure that would occur during an explosion, if the pressure relief device 37 for internal pressure reduction would not be present in the otherwise non-modified housing. The pressure relief device 37 for internal pressure reduction can comprise at least one flat part 37 of open-cell material, for example that can be, for example, attached to the cover, for example glued thereon. In the embodiment of the cover illustrated in FIG. 3, for example, two flat parts 37 made of open-cell material are glued on the inner side as inner pressure relief device 37.

The device 37 for inner pressure relief is, however, not configured to close the opening in the side wall 18 of the first housing part 11 for connection of the interior of the housing 10 and the outside of the housing 10 against ignition breakthrough and allowing the escape of non-ignitable gas instead, different to the pressure relief device 19. Rather the devices 37 for inner pressure relief are configured and provided to absorb heat energy in case of occurrence of an explosion in order to cool the explosion gas and thereby lower pressure peaks. The effect of the pressure relief device 37 for internal pressure reduction can be additionally or alternatively based on other physical principles in that these, for example the flat part 38 of open-cell material, are deformed by the explosion pressure shock and thereby absorb kinetic energy and thus result in a reduction of pressure peaks. In any case, the pressure relief device 37 for internal pressure reduction does preferably not establish a connection between the interior of the housing 10 and the environment of the housing 10 in order to release gas from the housing 10, but the device 37 for internal pressure reduction absorbs a part of the explosion energy in order to dampen the explosion effect, however, without the need to release gas from the interior of the housing 10 outwardly. Gaps that lead through the porous material of the device for internal pressure reduction 37 are preferably not flameproof. In other words the open-cell material of the device for internal pressure reduction 37 is not flameproof.

Figure 6:
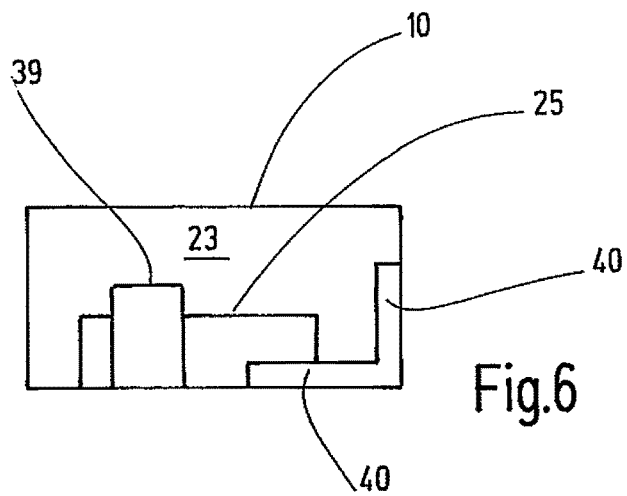

FIG. 6 shows a side view in the interior of a protective housing 10 according to an embodiment in a highly schematic manner. An operating apparatus 25 that can create sparks is illustrated in a highly schematic manner. In addition or as an alternative to the device 37 for internal pressure reduction, as shown in FIG. 3 and/or the pressure relief device 19 that provides a flameproof connection between the interior of the housing 10 and the environment of the housing 10, additional or other devices for internal pressure reduction can be arranged in the interior 23 of the housing 10. For example, a body 39 comprising open-cell material can be arranged in the chamber 23 that is accessible on at least four or at least five sides of the body 39. Alternatively or additionally, one or more walls can be provided with open-cell flat material 40. By means of cooling of the explosion gases and/or by absorption of kinetic energy the devices 37, 39, 40 for internal pressure reduction and the pressure relief device 19 for exchange of gas between the interior 23 and the environment of the housing 10 finally serve the avoidance of pressure peaks, such that the elastically deformed sealing 32 can withstand the actually occurring explosion overpressure and thus a flameproof sealing between the first sealing surface 13 and the second sealing surface 14 is ensured in case of occurrence of an explosion in the interior of the housing 10. The open-cell material of the body 39 and the flat material 40 do not have to be flameproof.

Figure 7:
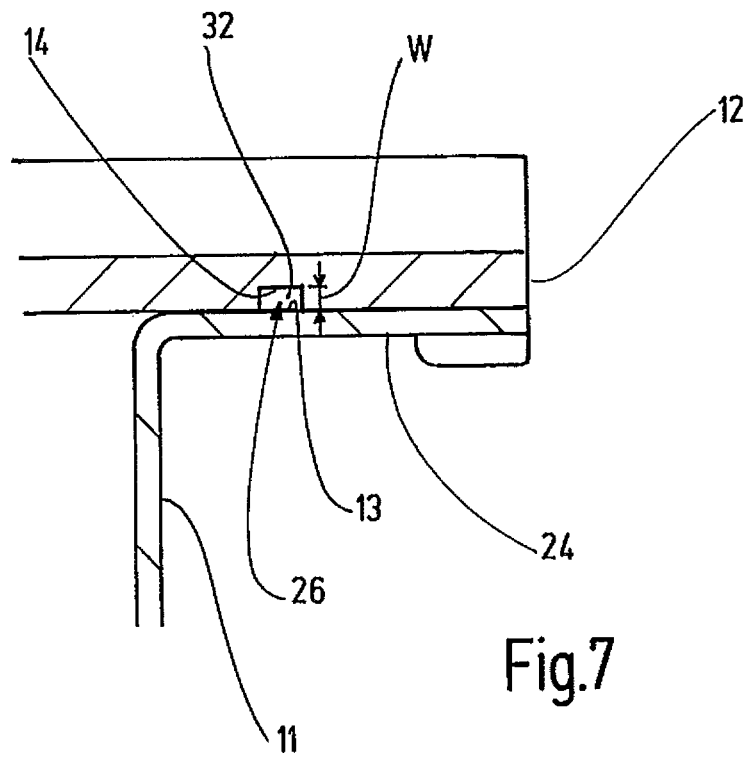

By means of the one or more devices 19, 37, 39, 40 for pressure reduction, particularly long sealings 32 (measured along the circumference in a closed manner) can be provided or long joints (measured along the circumference in a closed manner) between the housing parts 11, 12 can be sealed in a flameproof manner. FIG. 7 shows a partly sectional illustration according to the section line S2 shown in FIG. 1. The joint 26 between the first sealing surface 13 and the second sealing surface 14 comprises a width W corresponding to the height H of the elastically deformed sealing 32 therebetween. The width W is measured orthogonal to the direction (indicated by arrow P) or the path that gas would choose in case of an explosion with missing sealing 32 through the joint 26 between the first sealing surface 13 and the second sealing surface 14. The width is preferably measured transverse or orthogonal to the first sealing surface 13 and/or the second sealing surface 14 and corresponds to the distance between the first sealing surface 13 and the second sealing surface 14. The width W is measured orthogonal to the circumferential direction or to the length of the joint 26 or the sealing 32. The length of the joint or the sealing body corresponds to the circumference or circumferentially closed measured length of the sealing ring 32 or the length of a line that connects virtual center points of the cross-sections of the sealing body 32 with one another. In the embodiment illustrated in FIGS. 1, 2 and 3 the length of the joint is the sum of the lengths of the four straight sections of the groove 30. The ratio of the length to the width W of the joint or the length to the height of the sealing can be, for example, 100 or higher. In this sense, the inventive sealing 32 or the joint 26 between the first sealing surface and the second sealing surface is preferably a long sealing 32 or a long joint 26.

Figure 8:
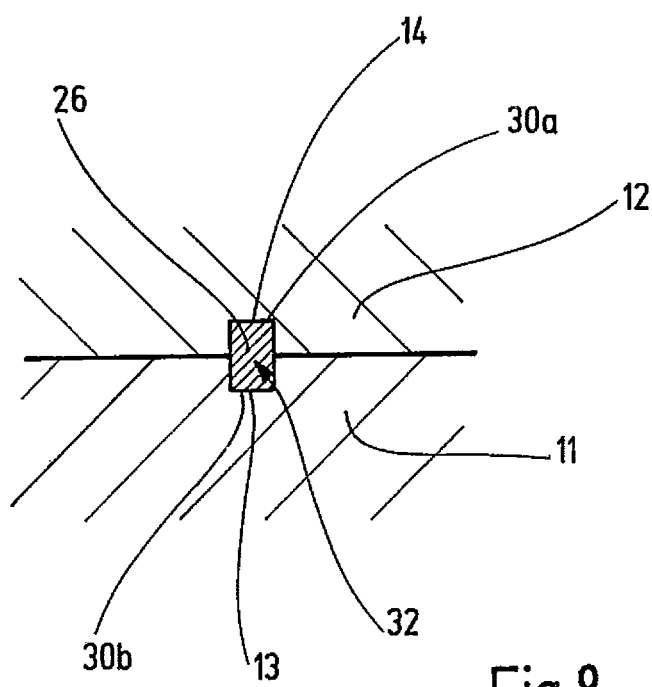

An exemplary sectional view through surfaces of the first housing part 11 and the second housing part 12 facing each other in closed condition of the housing 10 according to a further embodiment is illustrated in FIG. 8. According to the configuration of a tongue and groove connection, a sealing ring 32 is arranged in grooves 30a, 30b arranged opposite to one another that are provided in the surface of the first housing part 11 and the facing surface of the second housing part 12.

For closing the housing 10 (for the first time) it can be proceeded as follows, wherein by way of example the first housing part 11 is considered as illustrated in FIG. 2:

The sealing ring 32 (e.g. according to FIG. 4) can be placed on the second sealing surface 14 for closing the housing 10, particularly inserted in the groove 30. As an alternative, the sealing ring 32 can be placed on the first sealing surface 13, particularly if the groove 30 is missing in the cover 12. The sealing ring 32 can be glued to the first sealing surface 13 or the second sealing surface 14. Alternatively, the sealing 32 can be applied on the first sealing surface 13 or the second sealing surface 14, e.g. in a pasty and/or liquid form, where the sealing material is transformed into a(n) (rubber) elastical condition by means of a chemical and/or physical process.

The cover 12 (e.g. according to FIG. 3) is arranged on the first housing part 11 such that the sealing 32 is arranged between the first sealing surface 13 and the second sealing surface 14. The cover 12 is illustrated in FIGS. 1 and 2, the connection is form-fit in direction of the elastical deformation of the sealing 32 that is created during establishing of the connection. Alternatively or additionally, the connection in direction of the elastical deformation can be force-fit. In any case, a resetting force based on the elastically deformed sealing that tends to urge the cover 12 and the first housing part 11 away from one another is compensated by means of the connection in order to maintain the elastical deformation. After the establishment of the connection including an elastical deformation to or about a predefined amount, the housing illustrated in FIG. 2 is closed in an explosion-proof manner.

However, an explosive mixture can accumulate in the housing 10. Particularly gas can enter from outside into the chamber 23 surrounded by the housing and can form an explosive mixture there, if the housing 10 is not gas-tight, e.g. if the housing comprises a pressure relief device 19 that creates a connection between the interior 23 of the housing 10 and the environment 21, as in the embodiment according to FIGS. 1 and 2. The electrical operating means 25 that are arranged in the interior 23 of the housing 10 can create a spark. This is also allowed in the context of the protection category flameproof enclosure. The explosion ignited thereby leads to an overpressure in the interior of the housing 10. The one or more pressure relief devices 19, 37, 39, 40 are dimensioned such that the overpressure is limited to a certain maximum value (equal or less than the defined maximum value) that is remarkably below the maximum value that would occur, if one or more of the pressure relief devices 19, 37, 39, 40 would not be provided. This predefined maximum overpressure is, however, selected so low that the sealing 32 maintains the joint 26 between the first sealing surface 13 and the second sealing surface 14 closed in a flameproof manner also during the occurrence of an explosion. The overpressure (difference between pressure and atmospheric pressure) based on the explosion can be without the one or more pressure relief devices 19, 37, 39, 40, for example, larger or equal to 10 bar. With the one or more pressure relief devices 19, 37, 39, 40 the maximum pressure can be, for example, less or equal to 1 bar.

Explosions can occur also repeatedly. At least during the explosions the sealing 32 maintains the joint 26 between the first sealing surface 13 and the second sealing surface 14, however, closed in a flameproof manner, preferably also between the explosions. Thus, it is preferred that not the explosion pressure that presses the sealing 32 finally against the first sealing surface 13 and the second sealing surface 14, but already the elastical deformation based on the established connection between the first housing part 11 and the second housing part 12 closes the joint 26 in a flameproof manner.

Preferably the housing 10 can be open in a non-destructive manner. Particularly, the housing parts 11, 12 do not have to be damaged or destroyed thereby. Also the sealing ring 32 remains preferably undamaged. Preferably the sealing ring 32 can be reused after opening again for the flameproof closing of the housing 10. However, independent from whether a new sealing ring 32 has to be used or whether the old sealing ring 32 can be reused, the housing 10 can be preferably reclosed.

In known housings of the protection category "flameproof enclosure" a flat gap is provided in the closed condition of the housing in the joint between the cover and the housing part that encloses the interior that is flameproof. Therefore, in case of an explosion, gas can escape through the joint between the cover and the housing part. In the prior art sealing rings arranged in the joint are unable to avoid this. They only serve to keep humidity outside of the housing. In housings with sealing ring and flat gap known from the prior art, the sealing rings is unable to seal the joint between the cover and the housing part in a flameproof manner, particularly during occurrence of an explosion. The surfaces on the cover and the housing part have to be necessarily configured that they define a gap that avoids ignition breakthrough. This requires the compliance with small tolerances during manufacturing of the cover and the housing.

In the inventive housing 10 the housing parts 11, 12, particularly the first sealing surface 13 and the second sealing surface 14 can be manufactured according to broader tolerances as it would be the case for providing of a flameproof flat gap at this location 26. This simplifies the manufacturing of an inventive housing 10.

Based on the simpler requirements for the first sealing surface 13 and the second sealing surface 14 or for the first housing part 11 and the second housing part 12, housings 10 can be created that do not only comprise one access opening 22 (as housing 10 according to FIG. 1), but multiple access openings (at least two) through which an access of the operating means 25 is possible, which are however closed in a flameproof manner by means of seals 32 in closed condition of housing 10 according to the invention. In a modification of the housing 10 illustrated in FIG. 1, for example, the bottom does not have to be connected with the remaining tub or box-shaped first housing part in a monolithic manner, but a separate second housing part can form the bottom that according to the flange connection between cover 12 and first housing part 11 is connected with a frame part by means of a flange connection. The frame part surrounds an interior of the housing and comprises two opposite access openings, one of which is closed by the cover and the other by the bottom by means of inventive elastically deformed sealings between first and second sealing surfaces in a flameproof manner. In embodiments of the housing with one or more access openings, preferably each access opening is sealed by means of a respective sealing in a flameproof manner, also in case of an explosion.

For explanation of the embodiment according to FIGS. 9a and 9b, the explanations can be taken into consideration made to the other embodiments as far as it is not described differently in the following.

Figure 9A:
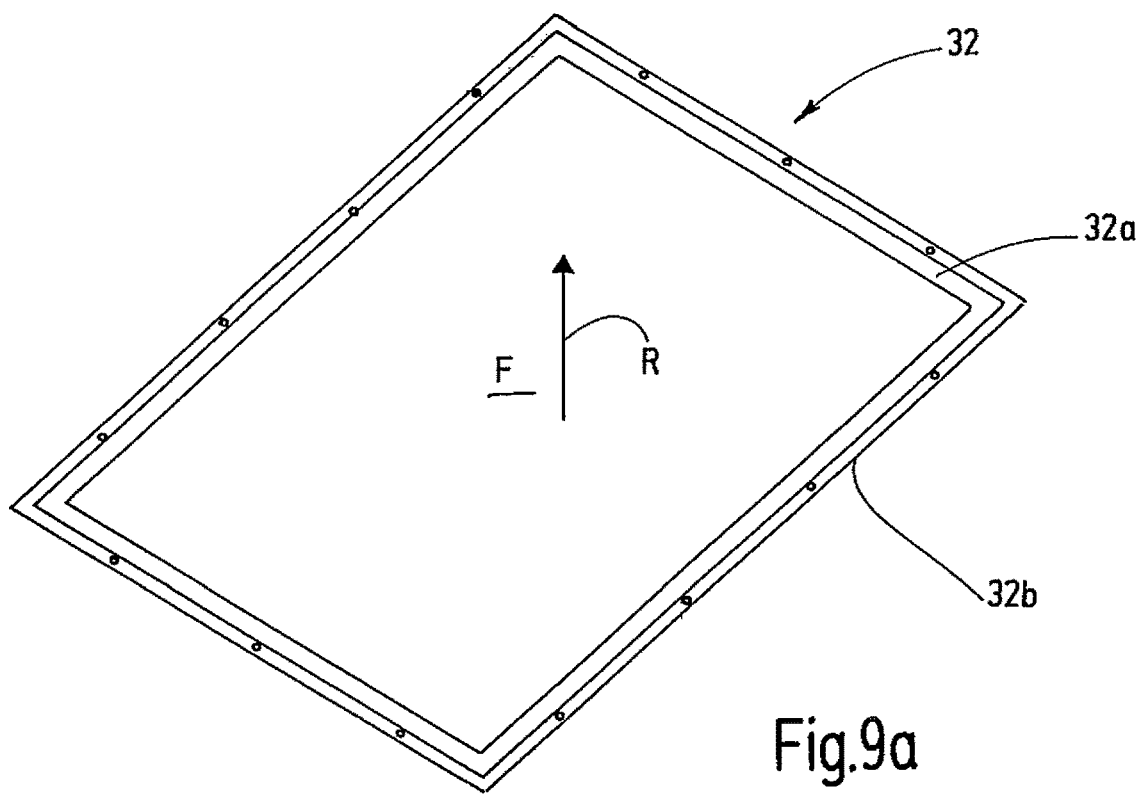

FIG. 9a shows by a way of example a ring or frame-shaped sealing body 32 of the embodiment in a non-elastically deformed condition. The sealing body 32 can comprise an inner section 32a that actually affects the flameproof closure and an outer section 32b surrounding the inner section 32a that can be connected with the inner section 32a, e.g. by gluing or welding. In embodiments the inner section 32a and the outer section 32b can be seamlessly integrally connected with one another. In other embodiments the sections 32a and 32b can be separate parts.

The sealing body 32 defines an opening area F. A normal vector of the opening area F is directed in normal direction R. The inner section 32a can be more resilient parallel to the normal direction R of the opening area F that is orientated orthogonal to the opening surface, than the outer section 32b. The dimension (thickness) of the inner section 32a measured in normal direction R can be larger than the dimension of the outer section 32b at least in the non-elastically deformed condition parallel to the normal direction R of the opening area F.

The inner section 32a and/or the outer section 32b are preferably made of metal. The inner section 32a and/or the outer section 32b can, e.g. form sheet metal strips. The inner section 32a can be, e.g. manufactured substantially from a sheet metal part in which the opening is cut. Alternatively or additionally, the outer section 32b can be manufactured from a sheet metal part in which an opening is cut in which the inner section 32a is arranged. Bores are provided in the outer section 32b through which screws may pass in order to connect the second housing part 12 and the first housing part 11 with one another.

Figure 9B:
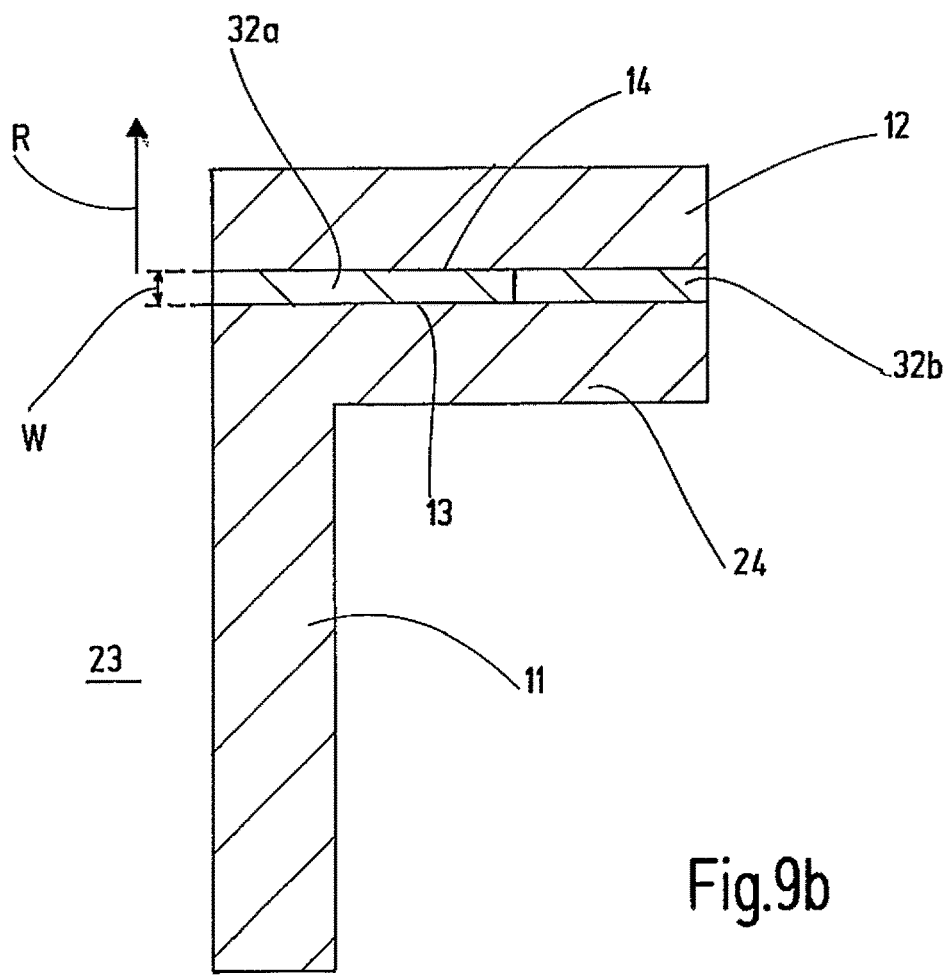

FIG. 9b shows the inner section 32a of the sealing body 32 in a cross-sectional view, elastically deformed parallel to the normal direction of the opening area F between the first housing part 11, a housing body having a flange 24 with a first sealing surface 13, and a second housing part 12, a cover with a second sealing surface 14. The outer section 32b forms a spacer or limits the dimension of the inner section 32a parallel to the normal direction R of the opening area F up to which the inner section 32a can be compressed. In doing so, damages of the inner section 32a are avoided, however, concurrently an indication is provided to the assembling person when the inner section 32a is sufficiently compressed in order to establish a flameproof condition.

In the arrangement according to FIG. 9b, the space in the joint between the first sealing surface 13 of the flame 24 of the housing body 11 and the sealing body 32 is so narrow and so long due to the dimension of the inner section 32a that explosion gases can exit the interior 23 of the housing 10 cooled at most, such that an ignition of the atmosphere outside the housing 10 cannot occur. The same applies for the space in the joint between the second sealing surface 14 of the cover 12 and the sealing body 32. The sealing body 32 itself is free of through passages. Gas cannot escape from the interior 23 of the housing through the sealing body 32 through the interstice between the first sealing surface 13 and the second sealing surface 14 also in case of an explosion, because no gas connection between the interior 23 of the housing 10 and the outer environment 21 of the housing 10 is established through the cross-section of the sealing body 32.

The inventive concept is also usable for housings 10 with large access openings. The ratio of the length of the space between the first sealing surface 13 and the second sealing surface 14 filled with the sealing body 32 to the width W of the space 26 between the first sealing surface and the second sealing surface is, for example, at least 100. The width W is measured in the direction of the elastical compression of the sealing body 32 or parallel to the normal direction R.

In FIGS. 10a to 10d an example of yet another embodiment of the inventive housing 10 is illustrated for which reference can be made to the other explanations relating to the other embodiments as far as it is not described otherwise in the following.

The housing 10 comprises a frame-shaped housing body 11 (first housing part) and two cover elements 41a, 41b (additional second housing parts) that can close one side of the housing body 11. Between the cover elements 41a, 41b and the housing body 11 a flat part is arranged that forms an intermediate frame 42. The intermediate frame forms a second housing part 12. The cover elements 41a, 41b can be hinged to the intermediate frame. The intermediate frame 42 comprises a web 43, e.g. in a center position, that separates the access opening 22 in the housing body in two opening parts.

Figure 10A:
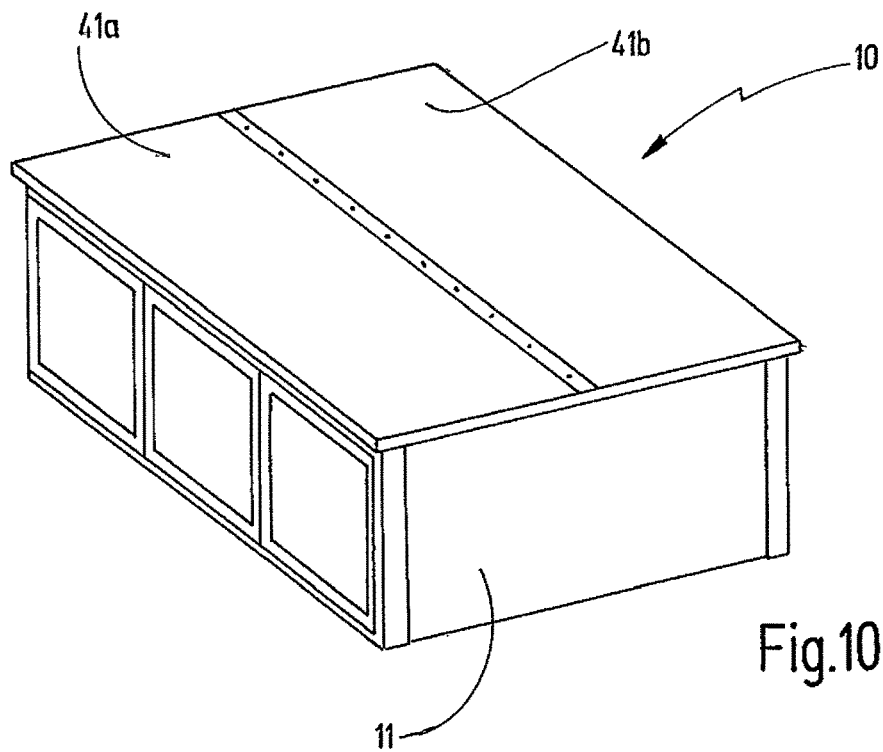
Figure 10B:
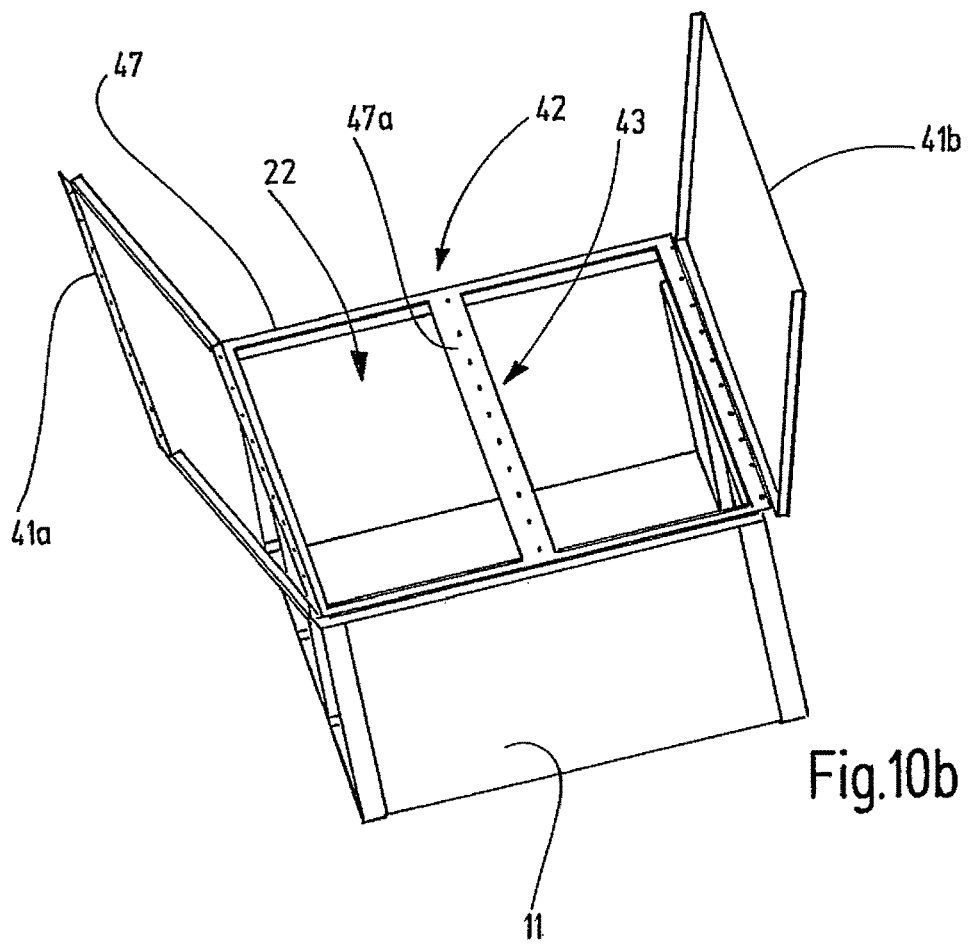
Figure 10C:
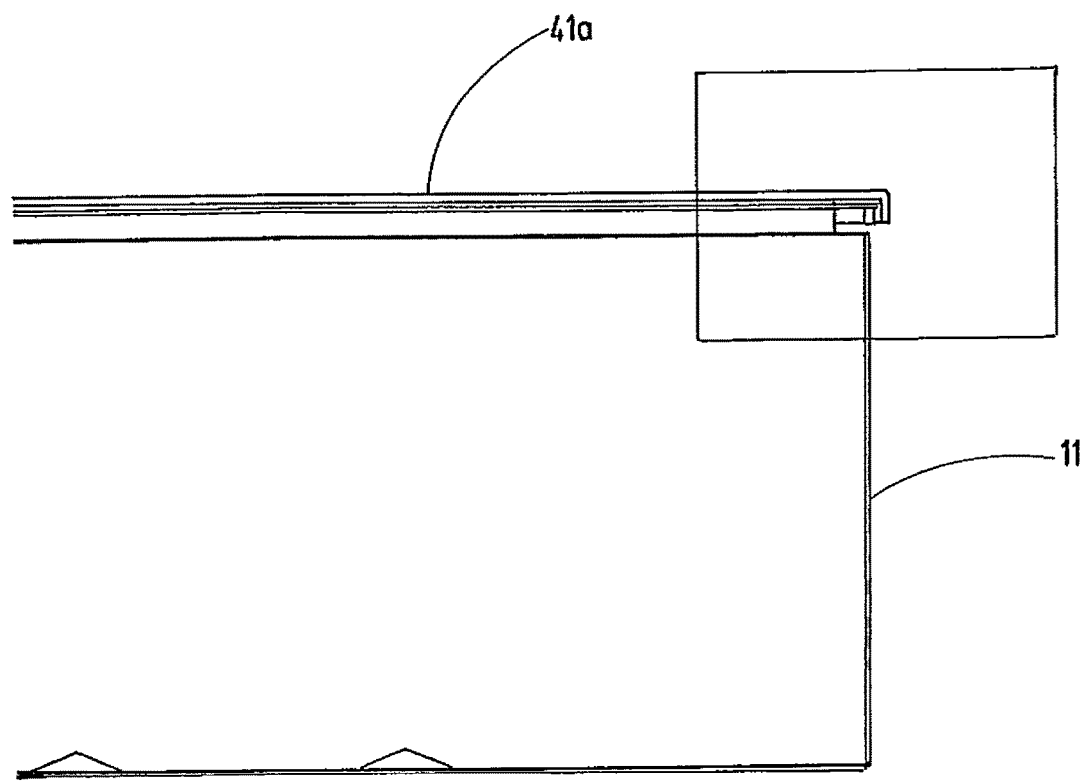
Figure 10D:
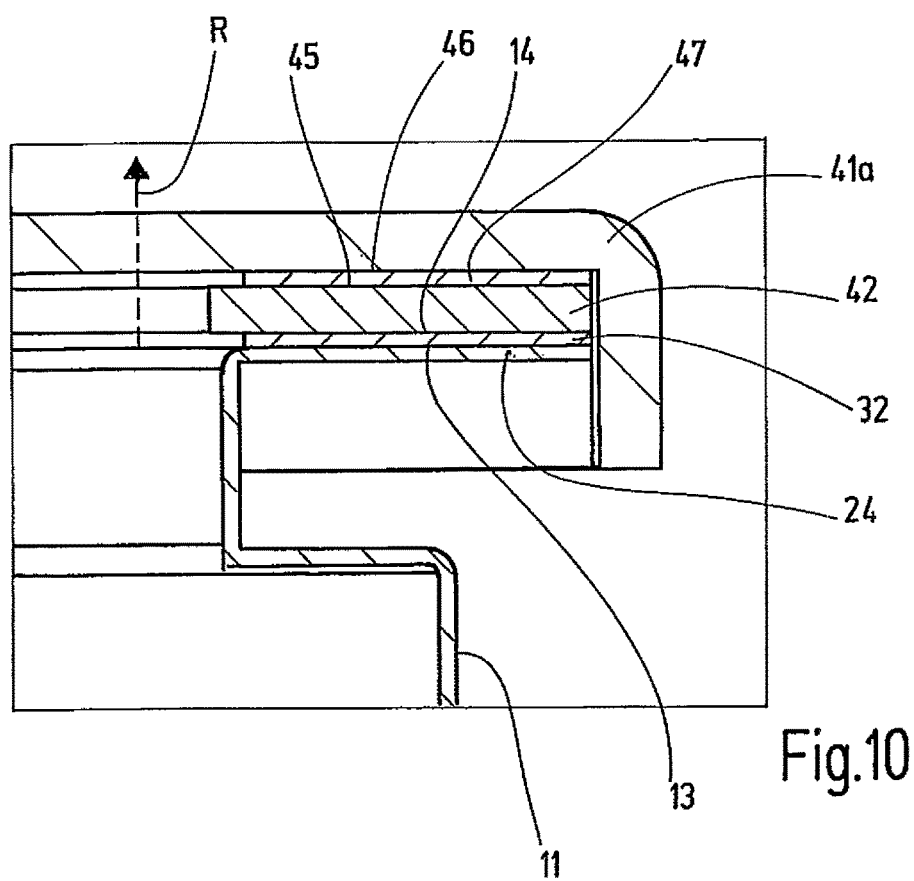

As particularly apparent from FIG. 10d, a frame-shaped sealing body 32 is arranged between the first sealing surface 13 of the flange section 24 of the housing body 11 and the second sealing surface 14 of the intermediate frame 42. Between another second sealing surface 45 of the intermediate frame 42 and the sealing surface 46 (third sealing surface) of the cover element 41a, a frame-shaped flat part is arranged as additional sealing body 47. A corresponding arrangement is provided between the other cover element 41b and the flange section 24. The additional sealing body 47 can extend in the closed condition between the two cover elements 41a, 41b on one side and the intermediate frame 42 on the other side (see FIG. 10b that shows the additional frame-shaped sealing body 47 with a web section 47a) or an individual additional sealing body is provided for each opening part. The sealing body 32 and the additional sealing body 47 are preferably more flexible in the direction parallel to the normal direction R of the opening area than the intermediate frame 42. The additional sealing body 47 can comprise one or more features described herein in connection with the sealing body 32.

In the arrangement according to FIG. 10d, the space in the joint between the first sealing surface 13 of the flange 24 of the housing body 11 and the sealing body 32 is so narrow and so long that explosion gases can exit the interior 23 of the housing 10 at most cooled, such that an ignition of the atmosphere outside the housing 10 cannot occur. The same applies for the space in the joint between the second sealing surface 14 of the intermediate frame 42 and the sealing body 32 as well as for the space in the joint between the additional second sealing surface of the intermediate frame 42 and the additional sealing body 47 and also for the space in the joint between the third sealing surface of the cover elements 41a, 41b and the additional sealing body 47. However, gas cannot escape through the sealing body 32 through the interstice between the first sealing surface 13 and the second sealing surface 14 also in case of an explosion and also not through the sealing body 48 through the interstice between the additional second sealing surface 45 and the third sealing surface 46, because through the cross-section of the sealing body 32 or through the cross-section of the sealing body 47 no gas connection is established between the interior 23 of the housing 10 and the outer environment 21.

For elastical deformation of the sealing body 32 between the intermediate frame 42 and the first housing part 11 and the additional sealing body 47 between the intermediate frame 42 and the cover elements 41a, 41b, the cover elements 41a, 41b can be, for example, screwed to the flange 24 of the first housing part 11.

In preferred embodiments of the inventive housing 10 a flameproof sealing of the joint 26 between the first housing part 11 and the second housing part 12 is solely established based on the elastical deformation of the sealing 32. Particularly filling the joint by casting between the first housing part and the second housing part after establishing the connection between the first housing part and the second housing part is not necessary in order to obtain a flameproof closure of the joint and is preferably not carried out. The elastical deformation of the sealing 32 is preferably obtained during establishment of the form- and/or force-fit, preferably not substance-bond connection between the first housing part 11 and the second housing part 12. The first sealing surface 13 and the second sealing surface 14 are preferably orientated transverse, particularly orthogonal, relative to the force with which the first housing part 11 and the second housing part 12 are pressed toward one another during establishment of the connection between the first housing part 11 and the second housing part 12. Between the first housing part 11 and the second housing part 12 a force- and/or form-fit connection is established that compensates the force applied by the elastically deformed sealing 32 on the first sealing surface 13 and the second sealing surface 14 in order to urge them away from each other and apart therefrom, withstands a force shock in case of an explosion in order to maintain the housing 10 closed in a flameproof manner.

According to the invention, a protective housing 10 in the explosion protection category flameproof enclosure is provided. Preferably at least one device 19, 36, 38, 39 for reduction of explosion pressure is assigned to the housing 10. Housing 10 comprises a first housing part 11 having a first sealing surface 13 and a second housing part 12 having a second sealing surface 14, wherein an elastical sealing 32 is held elastically deformed between the first sealing surface 13 and the second sealing surface 14 in the flameproof closed condition of the housing 10 and thus the space 26 between the first sealing surface 13 and the second sealing surface 14 is closed in a flameproof manner in case of an explosion in the interior of the housing 10. The inventive flameproof arrangement can replace a flat gap between, for example, a surface of a cover and a surface of a housing part that requires the compliance with relatively narrow manufacturing tolerances.

| List of Reference Signs: | |
|---|---|
| 10 | protective housing |
| 11 | first housing part |
| 12 | cover/second housing part |
| 13 | first sealing surface |
| 14 | second sealing surface |
| 15 | electrical feed-through |
| 16 | actuating device |
| 17 | display unit |
| 18 | side wall |
| 19 | pressure relief device |
| 20 | pressure relief body |
| 21 | outer environment |
| 22 | access opening |
| 23 | chamber/interior |
| 24 | flange |
| 25 | electrical operating apparatus or means |
| 26 | space/joint |
| 27 | bore |
| 28 | bore |
| 29 | surface |
| 30, 30a, 30b | groove |
| 31 | groove bottom |

-continued

List of Reference Signs:

| | |
|---|---|
| 32 | seal/sealing ring/sealing body |
| 32a | inner section |
| 32b | outer section |
| 33 | spacer |
| 34 | pore |
| 35 | fiber |
| 36 | elastomer |
| 37 | pressure relief device (device 37 for reducing the inner pressure) |
| 38 | flat part |
| 39 | body |
| 40 | flat material |
| 41a | cover element |
| 41b | cover element |
| 42 | intermediate frame |
| 43 | web |
| 44 | opening |
| 45 | additional second sealing surface |
| 46 | third sealing surface |
| 47 | additional sealing body |
| 47a | web section |
| S1 | section line |
| S2 | section line |
| W | width |
| H | height |
| P | arrow |
| F | opening area |
| R | normal direction |

The invention claimed is:

1. A protective housing in an explosion protection category of flameproof enclosures, wherein a device for reduction of explosion pressure is assigned to the protective housing, wherein the protective housing comprises a first housing part having a first sealing surface and a second housing part having a second sealing surface, wherein an elastical sealing body is held elastically deformed between the first sealing surface and the second sealing surface in a flameproof closed condition of the protective housing and a space between the first sealing surface and the second sealing surface is closed in a flameproof manner in case of an explosion in the interior of the protective housing, wherein the elastical sealing body when elastically deformed is free of through passages and the second housing part comprises an additional second sealing surface and the protective housing comprises a third housing part having a third sealing surface, wherein an additional elastical sealing body is held elastically deformed between the additional second sealing surface and the third sealing surface in a flameproof closed condition of the protective housing and thus closes a space between the additional second sealing surface and the third sealing surface in case of an explosion in the interior of the protective housing in a flameproof manner.

2. The protective housing according to claim 1, wherein a connection between the first housing part and the second housing part can be released in a non-destructive manner.

3. The protective housing according to claim 2, wherein the first housing part surrounds an access opening or defines an access opening that is closed by the second housing part.

4. The protective housing according to claim 3, wherein the protective housing comprises at least two access openings, wherein the space between the first housing part and the second housing part respectively is closed by the elastical sealing body elastically deformed between the first sealing surface and the second sealing surface in a flameproof manner.

5. The protective housing according to claim 4, wherein the first housing part is tub-shaped, box-shaped or frame-shaped and wherein the second housing part is a wall part.

6. The protective housing according to claim 1, wherein the first housing part surrounds an access opening or defines an access opening that is closed by the second housing part.

7. The protective housing according to claim 6, wherein the protective housing comprises at least two access openings, wherein the space between the first housing part and the second housing part respectively is closed by the elastical sealing body elastically deformed between the first sealing surface and the second sealing surface in a flameproof manner.

8. The protective housing according to claim 1, wherein the first housing part is tub-shaped, box-shaped or frame-shaped and wherein the second housing part is a wall part.

9. The protective housing according to claim 8, wherein the wall part is one of a cover, a bottom or a side wall part.

10. The protective housing according to claim 1, wherein the elastical sealing body has been arranged at or on the first sealing surface or the second sealing surface and subsequently the first sealing surface and the second sealing surface have been pressed toward one another for elastically deforming the elastical sealing body for closing the protective housing.

11. The protective housing according to claim 1, wherein the elastical sealing body comprises a closed-cell material.

12. The protective housing according to claim 1, wherein the elastical sealing body comprises an entangled fiber body, pores of the entangled fiber body are at least partly closed by an elastomer such that through passages for gas through a cross-section of the elastical sealing body are avoided.

13. The protective housing according to claim 1, wherein a ratio of a length of the space between the first sealing surface and the second sealing surface filled by the elastical sealing body to a width of the space between the first sealing surface and the second sealing surface is larger than 100.

14. The protective housing according to claim 1, wherein a spacer is arranged between the first sealing surface and the second sealing surface that defines a minimum distance between the first sealing surface and the second sealing surface.

15. The protective housing according to claim 1, wherein the first housing part and/or the second housing part comprises an elongated structure, wherein the elastical sealing body is contained in the structure or is arranged in a manner extending next to the structure or wherein the elastical sealing body forms a flat sealing.

16. The protective housing according to claim 15, wherein the elongated structure is a groove.

17. The protective housing according to claim 1, wherein the device for reduction of explosion pressure comprises an open-cell material.

18. The protective housing according to claim 1, wherein the device for reducing the explosion pressure comprises a pressure relief body that is arranged in an opening of the protective housing toward an environment of the protective housing.

19. The protective housing according to claim 1, wherein the device for reducing explosion pressure comprises open-cell material that is not flameproof.

* * * * *